US008329131B2

(12) United States Patent
Spielvogel et al.

(10) Patent No.: US 8,329,131 B2
(45) Date of Patent: Dec. 11, 2012

(54) ISOTOPICALLY-ENRICHED BORANES AND METHODS OF PREPARING THEM

(75) Inventors: Bernard Spielvogel, Hubbards (CA); Kevin S. Cook, Carl Junction, MT (US)

(73) Assignee: SemEquip, Inc., N. Billerica, MA (US)

( * ) Notice: Subject to any disclaimer, the term of this patent is extended or adjusted under 35 U.S.C. 154(b) by 0 days.

(21) Appl. No.: 13/109,778

(22) Filed: May 17, 2011

(65) Prior Publication Data

US 2011/0217223 A1 Sep. 8, 2011

Related U.S. Application Data

(62) Division of application No. 11/041,558, filed on Jan. 21, 2005, now Pat. No. 7,955,580.

(60) Provisional application No. 60/538,893, filed on Jan. 22, 2004.

(51) Int. Cl.
C01B 6/10 (2006.01)

(52) U.S. Cl. ...................................... 423/294
(58) Field of Classification Search .................... 423/294
See application file for complete search history.

(56) References Cited

PUBLICATIONS

L. Adams et al, "A New Syntheitic Route to Boron-10 Enriched Pentaborane (9) from Boric Acid and its Conversion to anti-10B18H22", Journal of the American Chemical Society 2002, 124, 7292-7293.*
P.G. Simpson et al, "Molecular, Crystal, and Valence Structures of B18H22", J. Chem. Phys. 1963, 39, 26.*
A. R. Pitocelli et al, "The Preparation of a New Boron Hydride B18H22", Journal of the American Chemical Society 1962, 84, 3218.*

* cited by examiner

*Primary Examiner* — Wayne Langel
(74) *Attorney, Agent, or Firm* — Edwards Wildman Palmer LLP; Peter F. Corless

(57) ABSTRACT

The invention provides new methods for synthesis of large boron hydride clusters, e.g., boron hydride molecules of the formula $B_nH_m$ where $5 \leq n \leq 96$ and $m \leq n+8$, wherein m and n satisfy the electron counting rules of macropolyhedral boranes. The invention is particularly useful for synthesis of octadecaborane ($B_{18}H_{22}$). Preferred methods of the invention include iteratively generating a conjugate acid from a salt of the $[B_aH_b]^{c-}$ or $[B_{n+2}H_{m-4}]^{2-}$ anion followed by degradation under conditions conducive to concentrating and drying of the conjugate acid to provide a borane $B_nH_m$ and residual salt of the $[B_aH_b]^{c-}$ or $[B_{n+2}H_{m-4}]^{2-}$ anion which is reused in the method of synthesis. The invention further provides isotopically enriched boranes, particularly isotopically enriched $^{10}B_{18}H_{22}$ and $^{11}B_{18}H_{22}$.

16 Claims, 2 Drawing Sheets

ISOTOPICALLY-ENRICHED BORANES AND METHODS OF PREPARING THEM

CROSS-REFERENCE TO RELATED APPLICATION(S)

This application is a Divisional Application of U.S. patent application Ser. No. 11/041,558, filed Jan. 21, 2005, now U.S. Pat. No. 7,955,580 which claims priority from U.S. Provisional Patent Application 60/538,893 which was filed on Jan. 22, 2004, both of which are incorporated by reference.

BACKGROUND

1. Field of the Invention

The invention provides methods for synthesizing borane compounds comprising between about 5 and about 96 boron atoms or more preferably between 5 and 36 boron atoms. The invention further provides isotopically enriched boron compounds prepared by the aforementioned methods. In certain aspects, the invention relates to $B_{18}H_{22}$, including $^{10}B$- and $^{11}B$-enriched $B_{18}H_{22}$, and methods of preparing same.

2. Background

Large boron hydride compounds have become important feed stocks for boron doped P-type impurity regions in semiconductor manufacture. More particularly, high molecular weight boron hydride compounds, e.g., boron hydride compounds comprising at least a five (5) boron atom cluster, are preferred boron atom feed stocks for boron atom implantation.

An important aspect of modern semiconductor technology is the continuous development of smaller and faster devices. This process is called scaling. Scaling is driven by continuous advances in lithographic process methods, allowing the definition of smaller and smaller features in the semiconductor substrate which contains the integrated circuits. A generally accepted scaling theory has been developed to guide chip manufacturers in the appropriate resize of all aspects of the semiconductor device design at the same time, i.e., at each technology or scaling node. The greatest impact of scaling on ion implantation processes is the scaling of junction depths, which requires increasingly shallow junctions as the device dimensions are decreased. This requirement for increasingly shallow junctions as integrated circuit technology scales translates into the following requirement: ion implantation energies must be reduced with each scaling step. The extremely shallow junctions called for by modern, sub-0.13 micron devices are termed "Ultra-Shallow Junctions" or USJs.

Methods of manufacturing boron doped P-type junctions have been hampered by difficulty in the ion-implantation process using boron. The boron atom, being light (MW=10.8), can penetrate more deeply into a silicon substrate and diffuse throughout the substrate lattice rapidly during annealing or other elevated temperature processes.

Boron clusters or cages, e.g., boranes have been investigated as a feed stock for delivering boron to a semiconductor substrate with reduced penetration. For example, as recited in commonly assigned International Patent Application PCT/US03/20197 filed Jun. 26, 2003, boron ions may be implanted into a substrate by ionizing boron hydride molecules of the formula $B_nH_m$ (where $100>n>5$ and $m\leq n+8$) and an ion source for use in said implantation methods. Certain preferred compounds for use in the boron ion implantation methods included decaborane ($B_{10}H_{14}$) and octadecaborane ($B_{18}H_{22}$).

Large boron hydride compounds, that is boron compounds having between 5 and about 100 boron atoms (more typically between 10 and about 100 or between 5 and about 25 boron atoms) are preferred for use in molecular ion implantation methods for delivering boron atoms to a semiconductor substrate. Typically two or more structural isomers exist of large boron hydride compounds, e.g., two or more compounds having the same chemical formula but different structural arrangement of boron atoms in the cage structure. In addition, two or more structurally related boron hydride compounds having the same number of boron atoms but different numbers of hydrogen atoms have been isolated for various sized boron clusters. Such compounds are frequently referred to as closo ($B_nH_n$), nido($B_nH_{n+2}$), arachno ($B_nH_{n+4}$), hypho ($B_nH_{n+6}$), conjuncto ($B_nH_{n+8}$), and the like. Thus, a plurality of different boron hydride species, including structural isomers and compounds containing various amounts of hydrogen are frequently known for boron hydrides having n boron atoms. See, for example, Jemmis, et al., *J. Am. Chem. Soc.*, v. 123, 4313-4323 (2001), which provides a review of various macropolyhedral boranes and known compounds having n boron atoms and various amounts of hydrogen.

Mixtures of structural isomers and mixtures of n-boron atom containing boron hydrides are suitable for use in the implantation methods, in part, because the molecular ions generated by the ionization process of boron hydride mixtures will have uniform and narrow weight distributions.

Current synthetic technologies for the preparation of large boron hydride molecules, e.g., boron hydride molecules with more than 12 boron atoms, are often plagued by complicated synthetic processes, low isolated yields, and/or inconsistent reproducibility.

Kaczmarcyzk (*J. Am. Chem. Soc.*, v. 96, 5953-5954 (1974)) and Graham (U.S. Pat. No. 3,350,324) recite methods of fusing anionic dodecaborane polyhedral cages to generate macropolyhedral clusters. For example, Kaczmarcyzk recites degrading a conjugate acid of the dodecaborane anion in water followed by addition of tetramethylammonium hydroxide to generate a $[Me_4N]_5B_{48}H_{45}$ and $[Me_4MN]_2B_{24}H_{23}$. Graham recites a similar procedure.

For example, several reports issued in the mid-1960's regarding methods of preparing $B_{18}H_{22}$ by degradation of the conjugate acid of $[B_{20}H_{18}]^{2-}$. However, each of the synthetic procedures disclosed in these references have not been reproducible or offer the final product in unacceptably low yield.

Olsen described the preparation and exploratory chemistry of $B_{18}H_{22}$ in a paper published in *The Journal of the American Chemical Society* (*J. Am. Chem. Soc.*, v. 90, 2946-2952 (1968)). Olsen recites a certain method of preparing $B_{18}H_{22}$ which involves passage of a salt of the $[B_{20}H_{18}]^{2-}$ anion, dissolved in a mixed solvent of 90% absolute ethanol and 10% acetonitrile, through an acid ion-exchange column to yield a yellow solution of the hydrated conjugate acid of the $B_{20}H_{18}$ anion, e.g., $H_2[B_{20}H_{18}]\cdot xH_2O$. The solution is concentrated under vacuum and as the last traces of volatile solvent are removed, the yellow solution undergoes an exothermic reaction evolving appreciable quantities of hydrogen gas. After about 20 minutes, the evolution of gas ceases and a viscous yellow oil results. After an additional 12 hours on the vacuum line, the yellow oil is subjected to an extraction using a mixture of cyclohexane and water. The cyclohexane layer is separated from the water using a separatory funnel. Removal of cyclohexane yields $B_{18}H_{22}$ as a mixture of two isomers. Olsen reports an isolated yield of 53%.

In a preliminary disclosure, Hawthorne reports a similar procedure to the synthetic protocol of Olsen in which the initial solvent and the extraction conditions are modified (*J. Am. Chem. Soc.* 87, 1893 (1965)). That is, the residue of the conjugate acid, after concentration, is extracted with ether and subsequent addition of water induced effervescence. Hawthorne reports an isolated yield of 60% of $B_{18}H_{22}$ after purification by fractional crystallization and sublimation.

The Hawthrone publication further reports certain methods for the preparation of salts comprising the $[B_{20}H_{18}]^{2-}$ anion.

Chamberland recites the preparation of $(H_3O)_2B_{20}H_{18}\cdot 3.5H_2O$ by passing a salt of the $[B_{20}H_{18}]^{2-}$ anion through an acidic ion-exchange resin (*Inorganic Chemistry*, v. 3, 1450-1456 (1964)). Chamberland teaches that the conjugate acid of the $[B_{20}H_{18}]^{2-}$ anion is unstable and decomposes slowly to form $B_{20}H_{22}$ and boric acid. However, Chamberland fails to report a yield or level of conversion for this procedure.

U.S. Pat. No. 6,086,837, issued to Cowen, et al., relates to multi-step methods of synthesizing isotopically enriched decaborane, which methods include extensive purification processes and the use of enriched decaborane in boron neutron capture therapeutic pharmaceuticals.

Although there are several synthetic routes reported in the literature for the preparation of large boranes, they are lengthy and often produce compounds in notably low yields. It thus would be desirable to have new methods to synthesize boron hydride compounds. It would be particularly desirable to have new methods to synthesize $B_nH_m$ compounds (where n is between 5 and 48 and $m \leq n+8$) and more preferably to synthesize $B_{18}H_{22}$, $B_{20}H_{24}$, and related large boron hydride cluster molecules.

SUMMARY OF THE INVENTION

Remarkably, we have discovered new methods for the preparation of boron hydrides having between 5 and 96 boron atoms and more preferably preparation of boron hydrides having between 10 and about 48 boron atoms, including isotopically enriched boron hydride compounds. The invention is particularly useful for synthesis of $B_{18}H_{22}$ or $B_{20}H_{24}$ and isotopically enriched forms thereof. The present invention also relates to isotopically-enriched $B_{18}H_{22}$ in which ratio of boron isotopes is shifted from the natural abundance of boron, e.g., $B_{18}H_{22}$ in which the ratio of $^{10}B$ to $^{11}B$ is shifted from 19.9:81.1. More preferably the invention provides isotopically-enriched $B_{18}H_{22}$ in which at least 50% of the boron atoms are $^{10}B$ or in which at least 90% of the boron atoms are $^{11}B$.

A typical molecular ion beam of $B_{18}H_{22}$ contains ions of a wide range of masses due to loss of a varying number of hydrogens from the molecular ion as well as the varying mass due to the two naturally occurring isotopes. Because mass selection is possible in a implanter device used in semiconductor manufacture, use of isotopically enriched boron in $B_{18}H_{22}$ can greatly reduce the spread of masses, thereby providing an increased beam current of the desired implantation species. Thus, $^{11}B$ and $^{10}B$ isotopically-enriched $B_{18}H_{22}$ is also of great interest.

Preferred methods of synthesis provided by the invention generate a neutral boranes or a mixture of boranes in which each borane contains n boron atoms ($5<n<100$). Preferred methods of synthesis generate product mixtures having substantially uniform chemical composition, e.g., preferred methods of synthesis provide a compound of the formula $B_nH_m$, which may be present as one or more structural isomers. In certain other aspects, methods of synthesis which provide a mixture of boranes, each of which comprises n boron atoms and a different number of hydrogen atoms, are also contemplated by the present invention, in part because, such mixtures of various n boron atom boranes will generate substantially the same mixture of molecular ions when subjected to ionization during an implantation process as a borane composition comprising a single borane of the formula $B_nH_m$. Thus, methods which provide two or more borane compounds such as $B_nH_m$, $B_nH_p$, and the like, where $m \neq p$ (and preferably the absolute difference between m and p is less than about 8), are also contemplated by the invention.

Methods of synthesis contemplate the preparation of boranes and borane mixtures by degradation of the conjugate acid of any macropolyhedral borane salt of the formula $M_c[B_aH_b]$ where $10 \leq a \leq 100$ and c is a positive integer (typically c is between 1 and about 6). Any anionic boron hydride salts comprising at least one negatively charged boron hydride species having at least 5 boron atoms is suitable for use as a starting material in the methods of synthesis of the invention. Preferred borane species of the formula $M_c[B_aH_b]$ include those in which c is 1-5 or more preferably c is 1, 2, or 3, and $10 \leq a \leq 100$.

In certain aspects the invention provides methods of synthesizing a borane or a mixture of boranes, each borane having n boron atoms, the method comprising the steps of:

(a) contacting a mixture of a borane anion of the formula $[B_nH_b]^{c-}$ and at least one solvent with an acidic ion-exchange resin to produce $H_c[B_aH_b]$ or a hydrate thereof;

(b) degrading at least a portion of $H_c[B_aH_b]$ or the hydrate thereof to generate at least one borane of the formula, $B_nH_m$, by concentrating the mixture comprising $H_c[B_aH_b]$ or the hydrate thereof under reduced pressure;

(c) separating residual borane anion from product borane $B_nH_m$;

(d) repeating steps (a)-(d) with residual borane anion recovered in step (c), wherein n is an integer of from 5 to 96, $a>n$, $b \leq a+8$, c is an integer of 1-8, and $m \leq n+8$.

Certain preferred methods of synthesizing a borane having n boron atoms and m hydrogen atoms or a mixture of boranes, each of which comprising n boron atoms, is represented schematically in the flow chart of FIG. 1, wherein $n<a$, $b \leq a+8$, $m \leq n+8$, $1 \leq c \leq 6$, and M is a mono or divalent cation.

Preferred methods of the invention are suitable to prepare isomerically pure $B_nH_m$ boranes, mixtures of structural isomers of a $B_nH_m$ borane, and mixtures of boranes having n boron atoms and different numbers of hydrogen atoms, wherein each $B_nH_m$ borane may further consist of a mixture of structural isomers. That is, the methods of the invention, depending upon the number of boron atoms in the product $B_nH_m$ borane and in the salt of the $[B_aH_b]^{c-}$ anion provide a mixture of borane species having n boron atoms which mixture is capable of generating a molecular ion beam having a narrow mass distribution.

More particularly, preferred methods of the invention comprise (a) generating the hydronium ion salt of a boron hydride anion of the formula $[B_aH_b]^{c-}$; (b) degrading at least a portion of the hydronium ion salt or a hydrate thereof (e.g., $H_c[B_aH_b]\cdot xH_2O$) under conditions conducive to drying and/or dehydrating the hydronium ion salt (such as, exposure to a reduced pressure atmosphere, exposure to a desiccant, or exposure to a dry gas stream, or the like) to generate neutral boron hydride, $B_nH_m$; (c) separating the product neutral boron hydride, $B_nH_m$ from residual boron hydride anion $[B_aH_b]^{c-}$; and (d) repeating steps (a) through (c) with the boron hydride anion $[B_aH_b]^{c-}$ separated and recovered in step (c).

Preferred degradation conditions suitable for use in step (b) supra are not particularly limited. Although not wishing to be bound by theory, conditions conducive to removal of water and other solvents of crystallization from the hydrated hydronium ion salt, $H_c[B_aH_b]\cdot xH_2O$ (where x is a positive real number), are also suitable to induce degradation of at least a portion of the hydronium ion. Typically preferred degradation conditions include contacting the hydrated hydronium salt $H_c[B_aH_b] \cdot xH_2O$ with a reduced pressure atmosphere, a dry gas stream, or one or more drying agents such as molecular sieves, phosphorus pentoxide, alumina, silica, silicates and the like, or a combination thereof. Particularly preferred methods of synthesis comprise degradation conditions in step (b) in which the hydrated hydronium salt. $H_c[B_aH_b] \cdot xH_2O$, is contacted with a reduced pressure atmosphere at a temperature of at least about 0° C. (or more preferably at a temperature of between about 20° C. and about 150° C., or between about 20° C. and about 100° C.).

In a preferred aspect of the invention, a solution of an ammonium salt of the boron hydride anion, $[B_{n+2}H_{m-4}]^{2-}$ is contacted with an acidic ion-exchange resin to generate the corresponding hydronium salt $(H_2[B_{n+2}H_{m-4}])$ or hydronium salt hydrate $(H_2[B_{n+2}H_{m-4}] \cdot xH_2O)$; the solution containing the hydronium salt is concentrated under reduced pressure to remove solvent and to decompose at least a portion of the hydronium salt thereby generating hydrogen gas, boric acid and neutral boron hydride, $B_nH_m$; the neutral boron hydride $(B_nH_m)$ and residual boron hydride anion $[B_{n+2}H_{m-4}]^{2-}$ are separated by biphasic extraction; and residual boron hydride anion $[B_{n+2}H_{m-4}]^{2-}$ is recovered from the aqueous phase of the separation and resubjected to the acidic ion-exchange resin to generate additional neutral boron hydride, $B_nH_m$. A particularly preferred synthesis provides $B_{18}H_{22}$ from $[B_{20}H_{18}]^{2-}$ or $B_{20}H_{24}$ from $[B_{22}H_{20}]^{2-}$.

In a preferred aspect of the invention, a solution of an ammonium salt of the boron hydride anion, $[B_{n+2}H_{m-4}]^{2-}$ is contacted with an acidic ion-exchange resin to generate the corresponding hydronium salt $(H_2[B_{n+2}H_{m-4}])$ or hydronium salt hydrate $(H_2[B_{n+2}H_{m-4}] \cdot xH_2O)$; the solution containing the hydronium salt is concentrated under reduced pressure to remove solvent and to decompose at least a portion of the hydronium salt thereby generating hydrogen gas, boric acid and neutral boron hydride, $B_nH_m$; the neutral boron hydride $(B_nH_m)$ and residual boron hydride anion $[B_{n+2}H_{m-4}]^{2-}$ are separated by extracting the residue with hydrocarbon solvent and filtering; residual boron hydride anion $[B_{n+2}H_{m-4}]^{2-}$ is recovered from remaining residues through dissolution into acetonitrile and resubjected to the acidic ion-exchange resin to generate additional neutral boron hydride, $B_nH_m$. A particularly preferred synthesis provides $B_{18}H_{22}$ from $[B_{20}H_{18}]^{2-}$ or $B_{20}H_{24}$ from $[B_{22}H_{20}]^{2-}$.

Yet other preferred synthetic methods provided by the present invention include methods of synthesis using at least one salt comprising an anionic borane having between 10 and 96 boron atoms. Certain non-limiting examples of suitable borane salts are disclosed in, for example, Kaczmarczyk *J. Am. Chem. Soc.*, v. 96, 5953 (1974), Jemmis, et al., *J. Am. Chem. Soc.*, v. 123, 4313-4323 (2001), Spielvogel (U.S. Pat. No. 6,525,224), Wierema et al., *Inorganic Chemistry*, v. 8, 2024 (1969), Graham (U.S. Pat. No. 3,350,324), and "Chemistry of the Elements" by N. N. Greenwood and A. Earnshaw, Chapter 6, Butterworth and Heinemann (1986), each of which recites at least one salt comprising a borane anion having between about 10 and about 48 boron atoms.

The methods of synthesis, which provide boron hydride compounds $B_nH_m$ in high isolated yield (>50%) and with few synthetic procedures, are suitable for use in preparing isotopically enriched compounds, e.g., compounds in which the isotopic concentration of $^{10}B$ is 50% or more or the isotopic concentration of $^{11}B$ is 90% or more. Preparation of isotopically pure or isotopically enriched $^{10}B$ or $^{11}B$ boron hydride compounds is practical using the methods of synthesis of the invention due, in part, to the limited number of synthetic steps, mass efficiency, and high overall synthetic yield.

The invention further provides isotopically enriched octadecaborane compounds $(B_{18}H_{22})$ and other large boron hydride compounds prepared by the methods of the invention. More particularly, the invention provides octadecaborane compounds $(B_{18}H_{22})$ and other large boron hydride compounds in which at least 50% of the boron atoms are $^{10}B$ or compounds in which at least 90% of the boron atoms are $^{11}B$.

Other aspects of the invention are discussed infra.

BRIEF DESCRIPTION OF THE DRAWINGS

We first briefly describe the drawings of the preferred embodiment of the invention.

DETAILED DESCRIPTION OF THE INVENTION

Remarkably, we have discovered new methods for the preparation of boron hydrides, including $B_{18}H_{22}$ and related large boron hydride compounds, which can be useful as feed stocks for methods of implanting boron atoms in a substrate by molecular ion implantation.

In one preferred aspect, the invention provides a method of synthesizing a borane having n boron atoms and m hydrogen atoms, the method comprising the steps of:

(a) contacting a mixture of a borane anion of the formula $[B_{n+2}H_{m-4}]^{2-}$ and at least one solvent with an acidic ion-exchange resin to produce $H_2[B_{n+2}H_{m-4}]$;

(b) degrading at least a portion of $H_2[B_{n+2}H_{m-4}] \cdot xH_2O$ to generate $B_nH_m$ by concentrating and drying the mixture comprising $H_2[B_{n+2}H_{m-4}] \cdot xH_2O$;

(c) separating residual borane anion from product $B_nH_m$; and (d) repeating steps (a)-(c) with residual borane anion recovered in step (c), wherein n is an integer of from 5 to 48, $m \leq n+8$, and x is a non-negative real number.

Figure 1:
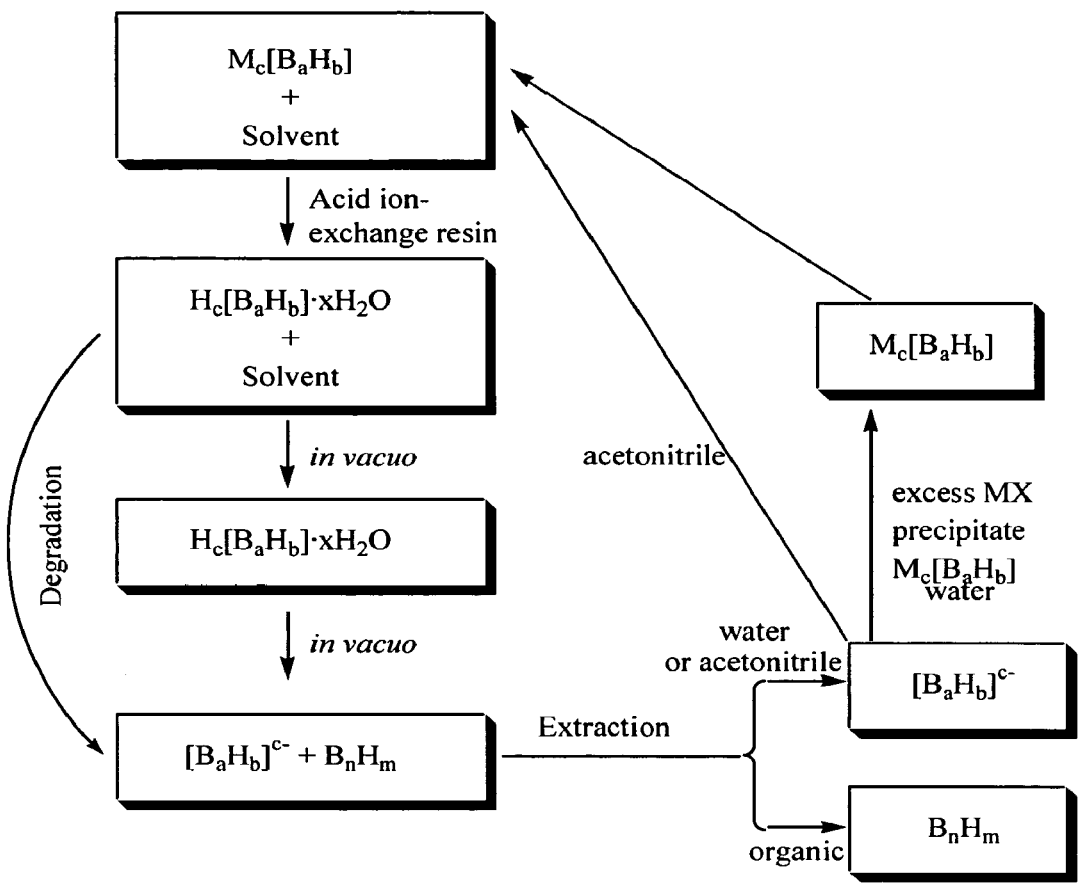
FIG. 1 is a flow chart of a method of synthesizing a borane having n boron atoms and m hydrogen atoms or a mixture of boranes, each of which comprising n boron atoms wherein $n<a$, $b \leq a+8$, $m \leq n+8$, $1 \leq c \leq 6$, and M is a mono or divalent cation.
Figure 2:
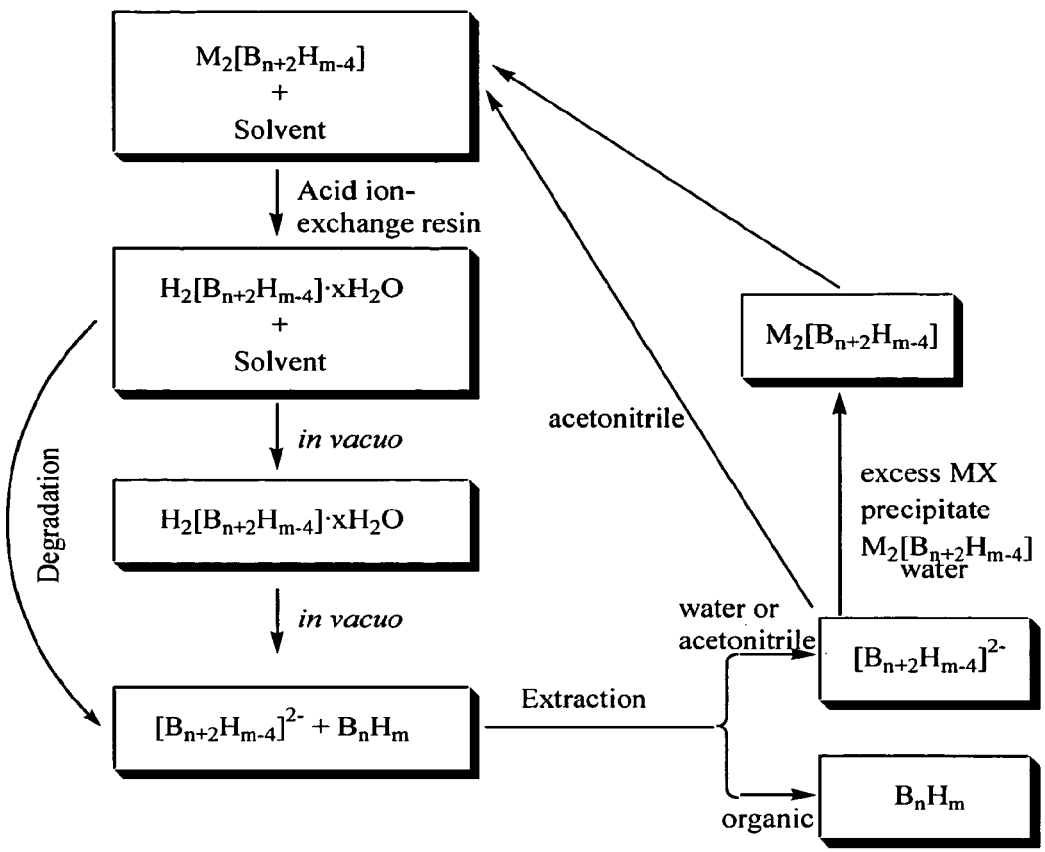
FIG. 2 is flow chart of a method of synthesizing a borane having n boron atoms and m hydrogen atoms wherein n is an integer of between 5 and 48 and $m \leq n+8$.

Certain preferred methods of synthesizing a borane having n boron atoms and m hydrogen atoms is represented schematically in the flow chart of FIG. 2.

Preferred methods of the invention provide methods of synthesis of borane hydride compounds having between 12 and 36 boron atoms, between 12 and 24 boron atoms, between 14 and about 22 boron, or more preferably having 16, 18, 20, or 22 boron atoms. Certain particularly preferred methods of synthesis provided by the present invention include those in which the borane anion of the formula $[B_{n+2}H_{m-4}]^{2-}$ is $[B_{20}H_{18}]^{2-}$ and the boron hydride of the formula $B_nH_m$ is $B_{18}H_{22}$ or the borane anion of the formula $[B_{n+2}H_{m-4}]^{2-}$ is $[B_{22}H_{20}]^{2-}$ and the boron hydride of the formula $B_nH_m$ is $B_{20}H_{24}$.

In another preferred aspect, the invention provides methods of synthesis of isotopically enriched boron hydride compounds, including isotopically enriched $B_nH_m$ (where $5 \leq n \leq 48$ and $m \leq n+8$). Thus, the invention provides methods of preparing isotopically enriched $B_nH_m$, in which at least about 50% of the boron atoms present in $B_nH_m$ are $^{10}B$, at least about 80% of the boron atoms present in $B_nH_m$ are $^{10}B$, at least about 90% of the boron atoms present in $B_nH_m$ are $^{10}B$, at least about 95% of the boron atoms present in $B_nH_m$ are $^{10}B$, or more preferably at least about 99% of the boron atoms present in $B_nH_m$, are $^{10}B$. The invention further provides methods of preparing isotopically enriched $B_nH_m$, in which at least about 90% of the boron atoms present in the $B_nH_m$ are $^{11}B$, in which at least about 95% of the boron atoms present in the $B_nH_m$ are $^{11}B$, or more preferably in which at least about 99% of the boron atoms present in the $B_nH_m$ are $^{11}B$.

Preferred methods of synthesizing a borane having n boron atoms and m hydrogen atoms include those methods in which wherein steps (a)-(c) are repeated at least once. More preferably, steps (a)-(c) are repeated between about 2 and about 20 times, between about 3 and about 12 times or steps (a)-(c) are repeated 4, 5, 6, 7, 8, 9 or 10 times.

Preferred solvents for solutions of salts of the $[B_aH_b]^{c-}$ or $[B_{n+2}H_{m-4}]^{2-}$ anion which are suitable for the methods of the invention include any solvent or mixture of solvents capable of solublizing a salt of the $[B_aH_b]^{c-}$ or $[B_{n+2}H_{m-4}]^{2-}$ anion and the conjugate acid thereof. More particularly, certain preferred solvents which are suitable for the methods of the invention include alcohols, nitriles, oxiranes, ethers, esters formamides, acetamides, sulfones and mixtures thereof. More preferably the solvent is a lower alcohol (e.g., an alcohol having between one and six carbon atoms such as methanol, ethanol, isopropanol, n-propanol, and the like), acetonitrile, diethyl ether, tetrahydrofuran, dioxane, or a mixture thereof, or more preferably a mixture of methanol, ethanol, or acetonitrile. Particular preferred solvents for solutions of salts of the $[B_aH_b]^{c-}$ or $[B_{n+2}H_{m-4}]^{2-}$ anion include methanol, ethanol (including absolute ethanol and ethanol azeotropes with water or benzene), tetrahydrofuran, acetonitrile (or acetonitrile/water solutions), and mixtures thereof which may be anhydrous or comprise trace or residual water. Certain preferred solvents include ethanol/acetonitrile mixtures comprising between about 50% and about 99% ethanol by volume and between about 50% and about 1% acetonitrile by volume, or more preferably between about 80% and about 95% ethanol by volume and between about 20% and about 5% acetonitrile by volume.

The concentration of salt solutions of the $[B_aH_b]^{c-}$ or $[B_{n+2}H_{m-4}]^{2-}$ anion, which are suitable for use in the methods of the invention, is not particularly limited. Thus, preferred concentrations of the salt solutions include those at which the salt of the $[B_aH_b]^{c-}$ or $[B_{n+2}H_{m-4}]^{2-}$ anion, the intermediate hydronium salt ($H_c[B_aH_b]$ or $H_2[B_{n+2}H_{m-4}]$ and hydrates thereof), and product $B_nH_m$ borane are soluble. More particularly, concentrations of the salt solution of the $[B_aH_b]^{c-}$ or $[B_{n+2}H_{m-4}]^{2-}$ anion are between about 0.0001M to a saturated solution, or more preferably between about 0.001M to about 0.5 M or between about 0.005 M and about 0.1M.

Any acidic ion-exchange resin capable of exchanging cations of a borane anion with protons are suitable for use in the methods of synthesizing a borane having n boron atoms and m hydrogen atoms provided by the invention. Preferred acidic ion-exchange resins include cross-linked, solvent-insoluble resins having a plurality of acidic functional groups capable of exchanging a proton for the cation of the borane salt. Certain preferred acidic ion-exchange resins include aromatic or partially aromatic polymers comprising a plurality of sulfonic acid residues and more preferably include such aromatic or partially aromatic polymers which are cross-linked. Particularly preferred acidic ion-exchange resins include various commercially available crosslinked sulfonated polystyrene, such as Amberlyst or the like.

In yet other aspects of the present invention, the acidic ion-exchange resin may be replaced by a non-polymeric acid. More particularly, the acidic ion-exchange resin may be substituted by non-polymeric acid having a $pK_a$ of less than about 2 (or more preferably the acidic ion-exchange resin is replaced by a non-polymeric acid having a $pK_a$ of less than about 1 or less than about 0). Certain preferred non-polymeric acids having a $pK_a$ of less than 2 include mineral acids, sulfuric acid, phosphoric acid, sulfonic acids of the formula $RSO_3H$ (where R is alkyl, haloalkyl, aryl, or aralkyl), and mixtures thereof. Particularly preferred non-polymeric acids having a $pK_a$ of less than 2 include hydrochloric acid, hydrobromic acid, hydroiodic acid, hydrofluoric acid, perchloric acid, sulfuric acid, phosphoric acid, toluenesulfonic acid (including para-toluenesulfonic acid, meta-toluenesulfonic acid, ortho-toluenesulfonic acid, and mixtures thereof), triflic acid, methanesulfonic acid, benzene sulfonic acid, benzenedisulfonic acid, and the like.

Preferably, the salt solution of the $[B_aH_b]^{c-}$ or $[B_{n+2}H_{m-4}]^{2-}$ anion is contacted with at least one equivalent of acid, or more preferably two or more molar equivalents of acid. That is, the salt solution of the $[B_aH_b]^{c-}$ or $[B_{n+2}H_{m-4}]^{2-}$ anion is contacted with a sufficient amount of the acidic ion-exchange resin to generate a neutral hydronium salt of the $[B_aH_b]^{c-}$ or $[B_{n+2}H_{m-4}]^{2-}$ anion. More preferably, the salt solution of the $[B_aH_b]^{c-}$ or $[B_{n+2}H_{m-4}]^{2-}$ anion is contacted with between about 2 and about 10 molar equivalents of acid, between about 2 and about 9, 8, 7, or 6 molar equivalents of acid, or more preferably, the salt solution of the $[B_aH_b]^{c-}$ or $[B_{n+2}H_{m-4}]^{2-}$ anion is contacted with between about 2 and about 5 molar equivalents of acid.

The temperature at which the synthetic steps of the methods of the invention are conducted are typically within the range of the freezing point and the boiling point of the solvent or solvent mixture of each synthetic step. Thus, for example, the temperature at which the salt solution of the $[B_aH_b]^{c-}$ or $[B_{n+2}H_{m-4}]^{2-}$ anion is contacted with an acidic ion-exchange resin is typically within the temperature range defined by the freezing and boiling point of the solvent(s). Preferred temperatures for step (a) include those temperatures at which both the salt of the $[B_aH_b]^{c-}$ or $[B_{n+2}H_{m-4}]^{2-}$ anion and the hydronium salt thereof (e.g., $H_c[B_aH_b]$ or $H_2[B_{n+2}H_{m-4}]$ and hydrates thereof) are soluble and preferably include temperatures of between about −20° C. and about 100° C. More preferred temperature ranges for step (a) include those temperatures between about −10° C. and about 80° C., about 0° C. and about 70° C. or at or about room temperature (e.g., between about 15° C. and about 25° C.).

The contact between the salt solution of the $[B_aH_b]^{c-}$ or $[B_{n+2}H_{m-4}]^{2-}$ anion and the ion-exchange resin can be in a continuous flow arrangement (e.g., where the salt solution passes through a column packed with the acidic ion-exchange resin) or in a batch wise process (e.g., where a mixture of the salt solution of the $[B_aH_b]^{c-}$ or $[B_{n+2}H_{m-4}]^{2-}$ anion and the acidic ion-exchange resin are mixed in a vessel. After sufficient contact time the resin is separated from the salt solution.

Continuous flow arrangements are typically preferred for simplicity of design, ease of separation, and ease of ion-exchange regeneration. Typically, the salt solution is passed through a column packed with the acidic ion-exchange resin such that each portion of the salt solution is in contact with the resin, e.g., the solution "resides" in the column, for a specified period of time. Preferably, the solution residence time in the column is between about 1 second and about 24 hours. More preferably, solution residence time is between about 5 seconds and about 12 hours, between about 15 seconds and about 8 hours, between about 30 seconds and about 4 hours or between about 1 minute and about 2 hours.

Degradation of the hydronium salt, $H_c[B_aH_b] \cdot xH_2O$ or $H_2[B_{n+2}H_{m-4}] \cdot xH_2O$ (where x is a non-negative number), occurs after removal of substantially all of the solvent(s) and waters of hydration (e.g., the x equivalents of water) from the mixture which was contacted with the acid or acidic ion-exchange column. The residue after removal of the solvent is maintained under a reduced pressure for at least about 30 minutes during which time degradation of the hydronium salt occurs with a release of hydrogen gas. Typically, the residue is maintained under reduced pressure for at least one hour or more preferably the residue is maintained under reduced pressure for between about 1 and about 48 hours, or more preferably between about 2 and about 36 hours. Although the temperature at which the degradation occurs is not particularly limited, preferred methods of the invention include those in which the degradation occurs at between about 0° C. and about 200° C., between about 10° C. and about 150° C., or more preferably between about 15° C. and about 100° C.

As used herein, "in vacuo," "under reduced pressure" or "reduced pressure" refers to lowering the pressure within a reactor or vessel below atmospheric pressure. Typically preferred pressures include about 500 mm Hg or less, or more preferably pressures of less than about 250 mm Hg, less than about 100 mm Hg, less than about 50 mm Hg, less than about 10 mm Hg, less than about 1 mm Hg, less than about 0.1 mm Hg, less than about 0.01 mm Hg (i.e., less than about 10 mTorr), less than about 1 mTorr, or less than about 0.1 mTorr. Typically preferred pressures contemplated by the term "in vacuo" include pressures of less than 1 mm Hg and pressures of less than about 1 mTorr.

Separation of the product borane ($B_nH_m$) from at least one salt of the residual $[B_{n+2}H_{m-4}]^{2-}$ anion can be effected by any standard separation technique used in synthetic organic or inorganic chemistry and may include extraction, partial crystallization, chromatography, sublimation, or a combination thereof. Preferred separation methods suitable for use in the synthetic methods of the invention include extraction using a biphasic fluid. That is, the residue after partial or complete degradation of the hydronium salt, $H_2[B_{n+2}H_{m-4}]$ or $H_2[B_{n+2}H_{m-4}] \cdot xH_2O$, is dissolved in a biphasic mixture comprising an aqueous layer and an organic layer such that salts of the residual $[B_{n+2}H_{m-4}]^{2-}$ anion are dissolved in the aqueous layer and the product borane, $B_nH_m$, is dissolved in the organic layer. The organic and aqueous layers are then separated. Other preferred separation methods suitable for use in the synthetic methods of the invention include extracting the residues using a hydrocarbon solvent and filtering the slurry. That is, the residue after partial or complete degradation of the hydronium salt, $H_2[B_{n+2}H_{m-4}]$ or $H_2[B_{n+2}H_{m-4}] \cdot xH_2O$, comprises the slurry precipitate and the product borane, $B_nH_m$, is dissolved in the hydrocarbon layer. The organic layer is concentrated to provide the product borane, $B_nH_m$.

Preferred organic fluids suitable for use in the separation process include linear, branched and cyclic hydrocarbons, alkylethers, haloalkanes, esters, and mixtures thereof. More preferably, suitable organic fluids are selected from the group consisting of linear and branched $C_5$-$C_{16}$ alkanes, petroleum ether, $C_5$-$C_6$cycloalkanes which may be substituted with 0-3 alkyl groups, $C_2$-$C_4$alkylethers, $C_1$-$C_4$alkylacetates, and mixtures thereof. Other preferred organic fluids are selected from pentane, hexane, hexanes, heptane, cyclohexane, methylcyclohexane, diethyl ether, petroleum ether, and mixtures thereof. Halogen containing fluids, while contemplated for use in the methods of the invention, are generally not used in embodiments where mixtures of borane and halogenated solvents potentially generate shock sensitive compounds.

Recovery of the residual borane $[B_aH_b]^{c-}$ or $[B_{n+2}H_{m-4}]^{2-}$ anion from the aqueous layer of the biphasic separation preferably occurs by conversion of the hydronium salt, $H_c[B_aH_b] \cdot xH_2O$ or $H_2[B_{n+2}H_{m-4}] \cdot xH_2O$ into a salt form that is insoluble or sparingly soluble in water. Preferred water insoluble or sparingly soluble salts of the $[B_aH_b]^{c-}$ or $[B_{n+2}H_{m-4}]^{2-}$ anion include ammonium salts of the formula, $[NR^1R^2R^3R^4]_c[B_aH_b]$ or $[NR^1R^2R^3]_2[B_{n+2}H_{m-4}]$ (in which $R^1$, $R^2$, and $R^3$ are independently selected from the group consisting of alkyl and aralkyl, and $R^4$ is selected from hydrogen, alkyl, or aralkyl).

In preferred embodiments an amount of $NR^1R^2R^3$ or $[NR^1R^2R^3R^4]X$ (wherein X is an anion) sufficient to convert the hydronium salt, $H_c[B_aH_b]$ or $H_2[B_{n+2}H_{m-4}]$, (or hydrate thereof) into an ammonium salt is added to the aqueous layer. The resulting ammonium salt is less soluble than the hydronium salt and precipitates. The recovered ammonium salt of the $[B_aH_b]^{c-}$ or $[B_{n+2}H_{m-4}]^{2-}$ anion may be resubjected to steps (a)-(c) of the methods of the invention.

In certain embodiments, the tertiary amine is represented by ($NR^1R^2R^3$), wherein $R^1$, $R^2$, and $R^3$ are independently selected from the group consisting of $C_{1-20}$alkyl, $C_{6-10}$aryl, and $C_{7-10}$aralkyl, or any two of $R^1$, $R^2$, $R^3$ taken in combination form a heterocylic ring.

In certain preferred embodiments, the quaternary ammonium salt is represented by $[NR^1R^2R^3R^4]X$, wherein $R^1$, $R^2$, and $R^3$ are independently selected from the group consisting of $C_{1-20}$alkyl, $C_{6-10}$aryl, and $C_{7-10}$aralkyl, or any two of $R^1$, $R^2$, or $R^3$ taken in combination form a heterocyclic ring;

$R^4$ is selected from hydrogen, $C_{1-20}$alkyl, or $C_{6-10}$aryl; and

X is an anion.

Preferred tertiary amines which are suitable for in recovery of the residual $[B_aH_b]^{c-}$ or $[B_{n+2}H_{m-4}]^{2-}$ anion include compounds of the formula $NR^1R^2R^3$ wherein $R^1$, $R^2$, and $R^3$ are independently selected from the group consisting of $C_{1-6}$alkyl groups, or any two of $R^1$, $R^2$, or $R^3$ taken in combination form a heterocyclic ring.

Preferred ammonium salts which are suitable for in recovery of the $[B_aH_b]^{c-}$ or $[B_{n+2}H_{m-4}]^{2-}$ anion include compounds of the formula $[NR^1R^2R^3R^4]X$, wherein $R^1$, $R^2$, and $R^3$ are independently selected from the group consisting of $C_{1-6}$alkyl groups, or any two of $R^1$, $R^2$, or $R^3$ taken in combination form a heterocyclic ring;

$R^4$ is selected from the group consisting of hydrogen, and $C_{1-6}$alkyl; and X is chloride, fluoride, bromide, iodide, sulfate, bisulfate, phosphates (including hydrogen phosphate, dihydrogen phosphate), hexafluorophosphate, tetrafluoroborate, tetraarylborate (preferably, tetraphenylborate, tetra(4-trifluoromethylphenyl)borate, tetra(pentafluorophenyl)borate, and the like), arylsulfonates (preferably, benzenesulfonic acid, benzenedisulfonic acid, para-toluene sulfonic acid, and the like), or carbonate.

Preferred recycling steps provide recovery of at least about 80% of the residual borane $[B_aH_b]^{c-}$ or $[B_{n+2}H_{m-4}]^{2-}$ anion. More preferably at least about 85% or about 90% recovery of the residual borane $[B_aH_b]^{c-}$ or $[B_{n+2}H_{m-4}]^{2-}$ anion. Preferably, the amine or ammonium salt is selected to provide a salt which is insoluble or sparingly soluble in water. In certain embodiments, an excess of triethylammonium chloride provides about 90% recovery of the residual borane $[B_aH_b]^{c-}$ or $[B_{n+2}H_{m-4}]^{2-}$ anion.

The present invention further provides a method of synthesizing $B_{18}H_{22}$, the method comprising the steps of (a) contacting a mixture of a $[B_{20}H_{18}]^{2-}$ salt and at least one solvent with an acidic ion-exchange resin to produce $H_2[B_{20}H_{18}]$, $H_2[B_{20}H_{18}] \cdot xH_2O$ or a mixture thereof;

(b) degrading at least a portion of the $H_2[B_{20}H_{18}]$, $H_2[B_{20}H_{18}] \cdot xH_2O$ or mixture thereof to generate a residue comprising $B_{18}H_{22}$ by concentrating and drying the mixture comprising $H_2[B_{20}H_{18}] \cdot xH_2O$ under reduced pressure;

(c) extracting the residue with water and at least one water immiscible fluid to generate an aqueous solution and a water immiscible solution;
(d) contacting the aqueous solution with an alkyl amine or an alkyl ammonium salt to precipitate $(B_{20}H_{18})^{2-}$ salts; and
(e) repeating steps (a)-(d) at least once.

Preferred methods of synthesizing $B_{18}H_{22}$ include methods in which steps (a)-(d) are repeated at least once. More preferably, steps (a)-(d) are repeated between about 2 and about 20 times, between about 3 and about 12 times or steps (a)-(d) are repeated 4, 5, 6, 7, 8, 9 or 10 times.

Certain preferred methods of synthesizing $B_{18}H_{22}$ comprise the steps of
(a) providing a salt of $(B_{20}H_{18})^{2-}$;
(b) contacting the $(B_{20}H_{18})^{2-}$ salt in its free form, as a slurry in at least one non-aqueous solvent, as an aqueous solution, or as a solution in at least one non-aqueous solvent with an acid under conditions conducive to the formation of a conjugate acid of the $(B_{20}H_{18})^{2-}$ salt;
(c) removing volatile components of the solution comprising the conjugate acid of the $(B_{20}H_{18})^{2-}$ salt under conditions conducive to the degradation of at least a portion of the conjugate acid of the $(B_{20}H_{18})^{2-}$ salt;
(d) extracting the residue with water and at least one water immiscible fluid to generate an aqueous solution and a water immiscible solution;
(e) contacting the aqueous solution with an amine or an ammonium salt to precipitate $(B_{20}H_{18})^{2-}$ salts;
(f) repeating steps (b)-(e) at least once; and
(g) concentrating the combined non-aqueous solutions to afford $B_{18}H_{22}$.

Preferred methods of synthesizing $B_{18}H_{22}$ include methods wherein steps (b)-(e) are repeated at least once. More preferably, steps (b)-(e) are repeated between about 2 and about 20 times, between about 3 and about 12 times or steps (b)-(e) are repeated 4, 5, 6, 7, 8, 9 or 10 times.

Certain preferred methods of synthesizing $B_{18}H_{22}$ comprise the steps of
(a) providing a salt of $(B_{20}H_{18})^{2-}$;
(b) contacting the $(B_{20}H_{18})^{2-}$ salt in its free form, as a slurry in at least one non-aqueous solvent, as an aqueous solution, or as a solution in at least one non-aqueous solvent with an acid under conditions conducive to the formation of a conjugate acid of the $(B_{20}H_{18})^{2-}$ salt;
(c) removing volatile components of the solution comprising the conjugate acid of the $(B_{20}H_{18})^{2-}$ salt under conditions conducive to the degradation of at least a portion of the conjugate acid of the $(B_{20}H_{18})^{2-}$ salt;
(d) extracting the residue with hexanes or other suitable hydrocarbon solvents in which boric acid byproduct is insoluble
(e) repeating steps (c) and (d) until no further $B_{18}H_{22}$ is produced
(f) contacting the residues with acetonitrile to dissolve any $B_{20}H_{18}{}^{2-}$ containing salts
(g) repeating steps (b)-(f) at least once; and
(h) concentrating the combined hydrocarbon solutions to afford $B_{18}H_{22}$.

Preferred methods of synthesizing $B_{18}H_{22}$ include methods wherein steps (b)-(f) are repeated at least once. More preferably, steps (b)-(f) are repeated between about 2 and about 20 times, between about 3 and about 12 times or steps (b)-(f) are repeated 4, 5, 6, 7, 8, 9 or 10 times.

The invention further provides $B_{18}H_{22}$ comprising isotopically-enriched boron. Isotopically enriched boron hydrides, including isotopically enriched $B_{18}H_{22}$, are preferred feed stocks for ion implantation processes in part because isotopically labeled compounds have a more narrow mass distribution. Thus, the invention provides isotopically enriched $B_{18}H_{22}$, in which at least about 50% of the boron atoms present in the $B_{18}H_{22}$ are $^{10}B$, at least about 80% of the boron atoms present in the $B_{18}H_{22}$ are $^{10}B$, at least at least about 90% of the boron atoms present in the $B_{18}H_{22}$ are $^{10}B$, at least about 95% of the boron atoms present in the $B_{18}H_{22}$ are $^{10}B$, or more preferably at least about 99% of the boron atoms present in the $B_{18}H_{22}$ are $^{10}B$. The invention further provides isotopically enriched $B_{18}H_{22}$, in which at least about 90% of the boron atoms present in the $B_{18}H_{22}$ are $^{11}B$, in which at least about 95% of the boron atoms present in the $B_{18}H_{22}$ are $^{11}B$, or more preferably in which at least about 99% of the boron atoms present in the $B_{18}H_{22}$ are $^{11}B$.

Any process capable of recovering residual $[B_aH_b]^{c-}$ or $[B_{n+2}H_{m-4}]^{2-}$ anion is suitable for use in the methods of the invention. However, inducing precipitation of a salt of the $[B_aH_b]^{c-}$ or $[B_{n+2}H_{m-4}]^{2-}$ anion by addition of an excess of a trialkylamine, a trialkylammonium halide, or a tetraalkylammonium halide to the aqueous solution generated during the biphasic extraction is a preferred method of recovery.

Preferred syntheses of the invention include preparation of neutral $B_{18}H_{22}$, which may be generated as a single isomer or a mixture of structural isomers, from an ammonium salt of $[B_{20}H_{18}]^{2-}$. Typically, a solution of a triethylammonium salt or a tetraalkylammonium salt of $[B_{20}H_{18}]^{2-}$ and at least one organic solvent is contacted with an acidic ion-exchange resin to generate the conjugate acid $H_2[B_{20}H_{18}]\cdot xH_2O$, e.g., the hydronium salt of $[B_{20}H_{18}]^{2-}$. Removal of the solvent and degradation of $H_2[B_{20}H_{18}]\cdot xH_2O$ afforded a mixture of $B_{18}H_{22}$ and $H_2[B_{20}H_{18}]\cdot xH_2O$ which were separated by a water/hydrocarbon extraction. The boron hydride, $B_{18}H_{22}$, was recovered in the organic layer. Residual $[B_{20}H_{18}]^{2-}$ anion was recovered, with minimal mass loss, by conversion to an ammonium salt, followed by recontacting it with the acidic ion-exchange resin and degrading it under reduced pressure. After a plurality of iterations, moderate to high yields of pure $B_{18}H_{22}$ were obtained.

In a preferred method, the solid residues may be extracted using only hydrocarbon based solvents and eliminating the aqueous phase. After preliminary extractions the residues can be exposed to vacuum for further amounts of time and further product extracted. When no further $B_{18}H_{22}$ is being produce the residues can be dissolved into acetonitrile and subjected to acidic exchange resins and the process repeated until the dersired yield is reached. This version of the method eliminates any need to precipitate the ammonium salt which often "oils" and can be difficult to isolate.

As used herein, "borane" or "boron hydride" refers to compounds comprising boron and hydrogen. More particularly borane or boron hydride is indented to refer to boron hydrogen compounds of the formula $B_nH_m$ where $5 \leq n \leq 100$ and $m \leq n+8$ wherein m and n satisfy the electron counting rules of macropolyhedral boranes. Although in certain embodiments additional elements may be present in the boron hydride compounds, typically neutral boron hydride compounds consist essentially of boron and hydrogen. The terms borane and boron hydride are intended to encompass isomerically pure boranes, mixtures of steroisomers, diastereomers, and structural isomers of compounds of the formula $B_nH_m$, and mixtures of boranes of the formula $B_nH_{(m)i}$ where i is the number of different boranes and (m)i is the number of hydrogen atoms in each of the i borane compounds wherein each (m)i can be the same or different. Salts comprising a boron hydride anion comprise a cation that is selected from any cationic species capable of forming a stable isolable salt. Preferred cations include monovalent and divalent cations and include, for example, alkali metals, alkaline earth metals, and ammonium cations such as trialkylammonium and tetraalkylammonium cations.

As used herein, the term "alkyl" refers to monovalent straight, branched, or cyclic alkyl groups preferably having from 1 to 20 carbon atoms, most preferably 1 to 10 carbon atoms ("lower alkyl"). This term is exemplified by groups such as methyl, ethyl, n-propyl, iso-propyl, n-butyl, iso-butyl, n-hexyl, 2-methylpropyl, 3-methylbutyl, and the like.

As used herein, the term "cycloalkane" refers to cyclic aliphatic hydrocarbons having between 3 and about 10 ring carbon atoms, or more preferably between 5 and 8 or between 5 and 7 ring carbon atoms. Cycloalkanes may be substituted with one or more alkyl group substituents. This term is exemplified by compounds such as cyclopentane, cyclohexane, methylcyclohexane and the like.

As used herein, the term "aralkyl" refers to monovalent straight, branched or cyclic alkyl groups substituted by at least one aryl group, wherein the term "aryl" indicates aromatic groups containing only carbon in the aromatic ring such as phenyl, biphenyl, 1-naphthyl and 2-naphthyl. Specifically preferred aralkyl groups include benzyl, naphthylmethyl, phenethyl, 2-phenylethyl, and the like.

As used herein, the term "halo" or "halogen" refers to fluoro, chloro, bromo, or iodo.

As to any of the above groups that contain one or more substituents, it is understood by those skilled in the art, that such groups do not contain any substitution or substitution patterns which are sterically unfeasible and or synthetically impracticable.

The procedures reported by Olson and Hawthorne for preparing $B_{18}H_{22}$ comprise dissolving an ammonium salt of the $[B_{20}H_{18}]^{2-}$ anion (typically a trialkylammonium or tetraalkylammonium salt) in absolute ethanol or a 90:10 mixture of absolute ethanol and acetonitrile, passing the solution through an acid ion exchange column, and decomposing the protonated $[B_{20}H_{18}]^{2-}$ anion. The literature synthetic procedures recite isolated yields of $B_{18}H_{22}$ of 53% and 60%. However, Applicants were unable to reproduce the reported isolated yields, obtaining only small amounts of the desired product. Numerous variations of the literature conditions were investigated, including the use of anhydrous solvents, drying of the ion exchange column, solvent-water combinations and the like, with no improvement in the yield of isolated $B_{18}H_{22}$ (typically about 12% of the theoretical yield). Very large columns with large amounts of salt in solution passed through also consistently gave only a low yield upon workup. We conclude that the procedures given in the literature, do not produce the borane in the yield reported. Specifically, these procedures do not teach how to obtain consistently 50% or greater yields of the borane.

Surprisingly, it has been found that neutralization of the aqueous solution with a base (such as triethylamine) after separation of the organic solvents, or addition of more triethylammonium chloride, precipitates a salt of the $[B_{20}H_{18}]^{2-}$ anion from the aqueous solution. This salt, when redissolved in the original solvents (90:10 mixture of absolute ethanol: acetonitrile), passed through the acidic ion exchange column, and processed by the same procedure as the first extraction, provides another batch of $B_{18}H_{22}$ product. The recycling of the aqueous solution can be repeated until the residual starting material is exhausted. An overall yield of greater than 50% of $B_{18}H_{22}$ is obtained with this novel method.

In a preferred method, the solid residues may be extracted using only hydrocarbon based solvents and eliminating the aqueous phase. After preliminary extractions the residues can be exposed to vacuum for further amounts of time and further product extracted. When no further $B_{18}H_{22}$ is being produce the residues can be dissolved into acetonitrile and subjected to acidic exchange resins and the process repeated until the desired yield is reached. This version of the method eliminates any need to precipitate the ammonium salt which often "oils" and can be difficult to isolate.

The invention now being generally described, it will be more readily understood by reference to the following examples, which are included merely for purposes of illustration of certain aspects and embodiments of the present invention, and are not intended to limit the invention.

Example 1

A solution of $(Et_3NH)_2[B_{20}H_{18}]$ (33 g, 75.3 mmol) in 1500 mL of absolute ethanol:acetonitrile (90:10 by volume) was prepared and then passed through a 500 g acid ion-exchange column as described in Olsen (*J. Am. Chem. Soc.*, v. 90, 3946-3952 (1968)). Following the procedure provided by Olsen, 2.07 g (9.58 mmol) of $B_{18}H_{22}$ was obtained from the cyclohexane portion of the cyclohexane-water extraction of the viscous yellow oil. The aqueous solution and residue was treated with an excess of triethylammonium chloride which induced copious precipitation of reclaimed $(Et_3NH)_2[B_{20}H_{18}]$ (26.5 g, 60.5 mmol). Thus, after the first passage through the acid ion-exchange gave a 12.7% yield of the desired $B_{18}H_{22}$ boron hydride compound and an 80.3% recovery of the starting $(Et_3NH)_2[B_{20}H_{18}]$ salt (corresponding to a 7.6% loss of starting material). Redissolution of the recovered $(Et_3NH)_2[B_{20}H_{18}]$ in absolute ethanol:acetonitrile (90:10 by volume) mixture and passage through the regenerated acid ion-exchange column yielded another crop of product (ca 7.5 mmol). Subsequent passages of recycled $(Et_3NH)_2[B_{20}H_{18}]$ through a regenerated acid ion-exchange column afforded decreasing amounts of product and recycled starting material. After six (6) iterations, a combined 50% yield of $B_{18}H_{22}$ was isolated.

Although not wishing to be bound by theory, the available data indicates that for maximum production efficiency with an acid ion-exchange column of defined capacity, each passage through the column should be carried out with the maximum quantity of starting material.

Example 2

A solution of $(Et_3NH)_2B_{20}H_{18}$ (52.7 g, 120.1 mmol) in 320 mL of a 15:1 acetonitrile:water mixture was stirred with 300 g of acid exchange resin for 1 hour. The resin was filtered away from the yellow filtrate and rinsed with acetonitrile until the washings ran clear. The solution was concentrated on a rotary evaporator to ~300 mL and placed on a column containing 300 g of acid exchange resin. The solution was eluted with acetonitrile and volatiles removed until a viscous yellow oil resulted. However, the viscous yellow oil was continually exposed to vacuum until a yellow, soft, sticky solid was formed (about 48 hours). 4.6 g (21.2 mmol) of $B_{18}H_{22}$ was obtained from the cyclohexane portion of the cyclohexane-water extraction of the sticky yellow solid. The remaining $B_{20}H_{18}^{2-}$ was recycled by the addition of $NEt_3$ as in Example 1. The recovered $B_{20}H_{18}^{2-}$ was dissolved in 320 mL of a 15:1 acetonitrile:water and stirred over acidic exchange resin for 20 hours. The resin was filtered away from the yellow filtrate and rinsed with acetonitrile until the washings ran clear. The solution was concentrated on a rotary evaporator to ~300 mL and placed on a column containing 300 g of acid exchange resin. The solution was eluted with acetonitrile and volatiles removed until a viscous yellow oil resulted. After removal of most of the solvent the yellow sticky residue was subjected to high vacuum until a hard pale yellow solid resulted (about 48 hours). 7.4 g (34.1 mmol) of $B_{18}H_{22}$ was obtained from the cyclohexane portion of the cyclohexane-water extraction. Total yield of $B_{18}H_{22}$: 12.0 g, 55.3 mmol, 46.1%.

Example 3

25 mL of water was added to a solution of $(Et_3NH)_2B_{20}H_{18}$ (2823 g, 643.4 mmol) in 500 mL acetonitrile. The solution was placed onto a column containing 2 kg of acidic exchange resin and allowed to sit for 18 hours. The yellow solution was eluted with acetonitrile until the eluant ran clear. The collected acetonitrile solution was concentrated to ~500 mL and placed onto a second column with 2 kg of acidic exchange resin. The solution was eluted slowly over 2 hours and the column rinsed with acetonitrile and the washings ran clear. Acetonitrile was removed until a viscous yellow oil resulted. The oil was subjected to high vacuum until hydrogen evolution began and a hard solid formed (~10 days). The hard yellow solid was extracted using a mixture of 750 mL of cyclohexane and 750 mL of water. The cyclohexane layer was separated from the water and cyclohexane removed to give pale yellow $B_{18}H_{22}$ (43.7 g, 201.6 mmol) in 31.3% one pass yield. The water layer was neutralized with triethylamine to precipitate out any remaining $B_{20}H_{18}2-$. The above process was repeated to give further $B_{18}H_{22}$ (16.6 g, 76.6 mmol) in 43.2% total yield. Remaining $B_{20}H_{18}{}^{2-}$ was precipitated with triethylamine and combined with other $(Et_3NH)_2B_{20}H_{18}$.

Example 4

25 mL of water was added to a solution of $(Et_3NH)_2B_{20}H_{18}$ (273.7 g, 624.9 mmol) in 500 mL of acetonitrile. The solution was placed onto a column containing 2 kg of acidic exchange resin and allowed to sit for 18 hours. The yellow solution was eluted with acetonitrile until the eluant ran clear. The collected acetonitrile solution was concentrated to ~500 mL and placed onto a second column with 2 kg of acidic exchange resin. The solution was eluted slowly over 2 hours and the column rinsed with acetonitrile and the washings ran clear. Volatiles were removed until bright yellow crystals of $H_2B_{20}H_{18} \cdot xH_2O$ formed. The crystals were filtered off and the bulk of the filtrate removed by suction. The filtrate was concentrated further to produce further amounts of free acid which were similarly collected by filtration. This process was repeated until no further crystals formed. The wet yellow crystalline material was subjected to high vacuum until hydrogen evolution began and a hard solid formed (~5 days). The hard solid was broken up and $B_{18}H_{22}$ extracted with 500 mL of hexanes. Hexanes was filtered from the yellow solid and the hexanes removed to give $B_{18}H_{22}$ (8.0 g, 36.9 mmol). The exposure to vacuum and hexane extraction process was repeated until no further $B_{18}H_{22}$ formed. The remaining yellow solid was added to 500 mL of acetonitrile, the undissolved material filtered, and the filtrate run through two columns of acidic exchange resin and acetonitrile removed as before. The yellow residues were exposed to vacuum and extracted with hexane until no further $B_{18}H_{22}$ was produced. Yield: 54.5 g, 251.1 mmol, 40.1%.

Example 5

$(NEt_4)_2B_{20}H_{18}$ (10.8 g, 21.8 mmol) was dissolved into a solution comprising 40 mL of acetonitrile and 5 mL of water and then stirred over 54.0 g of acidic exchange resin for 24 hours. The resin was filtered off and washed thoroughly with acetonitrile. The filtrate and washings were combined and concentrated to a yellow oil. The oil was placed under vacuum until a hard solid formed (~5 days) and then extracted with 100 mL of hexanes. Removal of hexanes left pale yellow $B_{18}H_{22}$ (2.0 g, 0.92 mmol). The residue left over from the hexane extraction was exposed to vacuum and extracted a second time to remove more $B_{18}H_{22}$. Total yield: 2.8 g, 12.9 mmol, 59.2%.

Example 6

$^{11}B$ enriched $(NEt_3H)_2B_{20}H_{18}$ (17.4 g, 35.2 mmol) was dissolved into 50 mL of acetonitrile and 5 mL of $H_2O$. The solution was placed on a column containing 500 g of acidic exchange resin and allowed to sit for 18 hours. The solution was eluted from the column and the resin rinsed thoroughly with acetonitrile. The eluant and washings were combined and passed through a second column over 2 hours. Acetonitrile was removed to form a thick slurry containing yellow crystals of $H_2B_{20}H_{18} \cdot xH_2O$. The slurry was exposed to vacuum over 10 days to produce a hard pale yellow solid. To the solid was added 100 mL of $H_2O$ and 100 mL of hexanes and the mixture was stirred for 3 hours. The hexane layer was separated from the water layer, dried over $K_2CO_3$ and filtered. After removal of hexanes $^{11}B$ enriched $B_{18}H_{22}$ was left as a pale yellow powder (3.5 g, 16.1 mmol, 45.9%). $^{11}B$ enrichment was determined to be that of the starting $B_{20}H_{18}{}^{2-}$ (>98.6% $^{11}B$ isotopic enrichment).

The invention has been described in detail with reference to preferred embodiments thereof. However, it will be appreciated that those skilled in the art, upon consideration of the disclosure, may make modifications and improvements within the spirit and scope of the invention.

All of the patents and publications cited herein are hereby incorporated by reference.

Those skilled in the art will recognize, or be able to ascertain using no more than routine experimentation, many equivalents to the specific embodiments of the invention described herein. Such equivalents are intended to be encompassed by the following claims.

What is claimed is:

1. A method of synthesizing $B_{18}H_{22}$ comprising the steps of
   (a) providing a salt of $(B_{20}H_{18})^{2-}$;
   (b) dissolving the $(B_{20}H_{18})^{2-}$ salt in a fluid comprising at least one non-aqueous solvent;
   (c) contacting the $(B_{20}H_{18})^{2-}$ salt solution with an acid to generate a hydronium salt of $(B_{20}H_{18})^{2-}$;
   (d) removing volatile components of the solution in vacuo under conditions conducive to formation of $B_{18}H_{22}$ by degradation of at least a portion of the hydronium salt of $(B_{20}H_{18})^{2-}$;
   (e) extracting the residue with water and at least one water immiscible solvent;
   (f) contacting the aqueous solution with an alkyl amine or an alkyl ammonium salt to precipitate $(B_{20}H_{18})^{2-}$ salts;
   (g) repeating steps (b)-(f) at least once; and
   (h) concentrating the combined non-aqueous solutions generated in step (e) to obtain $B_{18}H_{22}$.

2. The method of claim 1, wherein the acid is a polymer.

3. The method of claim 1, wherein the acid is an acidic ion-exchange resin.

4. The method of claim 1, wherein the acid is a crosslinked polymer having a plurality of sulfonic acid residues.

5. The method of claim 1, wherein the acid is an organic acid having a pKa of less than about 2.

6. The method of claim 1, wherein the acid is an inorganic acid having a pKa of less than about 2.

7. The method of claim 1, wherein the non-aqueous solvent is selected from the group consisting of alcohols, nitriles, ethers, and combinations thereof.

8. The method of claim 7, wherein the non-aqueous solvent is methanol, ethanol, acetonitrile, tetrahydrofuran, dioxane, or a combination thereof.

9. The method of claim 8, wherein the non-aqueous solvent comprises between about 50% and about 99% ethanol by volume and between about 50% and about 1% acetonitrile by volume.

10. The method of claim 9, wherein the non-aqueous solvent comprises between about 80% and about 95% ethanol by volume and between about 20% and about 5% acetonitrile by volume.

11. The method of claim 1, wherein step (g) comprises repeating step (b) through step (f) between 3 and 15 times.

12. The method of claim 1, wherein at least about 95% of the boron atoms present in the product $B_{18}H_{22}$ are $^{10}B$.

13. The method of claim 1, wherein the alkyl amine or alkyl ammonium salt is selected from the group consisting of compounds of the formula $NR^1R^2R^3$ and ammonium salts of the formula $[NR^1R^2R^3R^4]X$, wherein $R^1$, $R^2$, and $R^3$ are independently selected from the group consisting of $C_{1-20}$alkyl, $C_{6-10}$aryl, $C_{7-10}$aralkyl, and any two of $R^1$, $R^2$, or $R^3$ taken in combination to form a heterocyclic ring;

$R^4$ is selected from the group consisting of hydrogen, $C_{1-20}$alkyl, and $C_{6-10}$aryl; and X is an anion.

14. A method of synthesizing $B_{18}H_{22}$ comprising the steps of
(a) providing a salt of $(B_{20}H_{18})^{2-}$;
(b) dissolving the $(B_{20}H_{18})^{2-}$ salt in a fluid comprising at least one non-aqueous solvent;
(c) contacting the $(B_{20}H_{18})^{2-}$ salt solution with an acid to generate a hydronium salt of $(B_{20}H_{18})^{2-}$;
(d) removing volatile components of the solution in vacuo under conditions conducive to formation of $B_{18}H_{22}$ by degradation of at least a portion of the hydronium salt of $(B_{20}H_{18})^{2-}$;
(e) extracting the residue with hydrocarbon solvent;
(f) contacting the remaining residues with acetonitrile to dissolve $(B_{20}H_{18})^{2-}$ salts;
(g) repeating steps (b)-(f) at least once; and
(h) concentrating the combined non-aqueous solutions generated in step (e) to obtain $B_{18}H_{22}$.

15. The method of claim 14, wherein the acid is a polymer.

16. The method of claim 14, wherein the acid is an acidic ion-exchange resin.

* * * * *